United States Patent [19]
Eccleston

[11] Patent Number: 5,498,595
[45] Date of Patent: Mar. 12, 1996

[54] METHOD OF ACTIVATION OF SUPERCONDUCTORS AND DEVICES PRODUCED THEREBY

[75] Inventor: William Eccleston, Liverpool, England

[73] Assignee: British Technology Group Limited, London, England

[21] Appl. No.: 291,578

[22] Filed: Aug. 16, 1994

Related U.S. Application Data

[63] Continuation of Ser. No. 35,899, Mar. 23, 1993, abandoned, which is a continuation of Ser. No. 634,861, Jan. 2, 1991, abandoned.

[30] Foreign Application Priority Data

Jul. 2, 1988 [GB] United Kingdom .................. 8815781
Jul. 2, 1988 [GB] United Kingdom .................. 8815783

[51] Int. Cl.$^6$ ....................................... C30B 1/10
[52] U.S. Cl. ........................... 505/235; 505/237; 505/238; 505/325; 117/2; 117/947
[58] Field of Search ...................... 505/237, 238, 505/235, 325; 117/2, 947

[56] References Cited

U.S. PATENT DOCUMENTS

| | | | |
|---|---|---|---|
| 4,900,716 | 2/1990 | Fujita et al. | 505/742 |
| 4,929,598 | 5/1990 | Bagley et al. | 427/62 |
| 5,051,396 | 6/1991 | Fujita et al. | 505/742 |
| 5,106,827 | 4/1992 | Borden et al. | 505/742 |

FOREIGN PATENT DOCUMENTS

| | | | |
|---|---|---|---|
| 0349341 | 1/1990 | European Pat. Off. | |
| 1-298005 | 12/1989 | Japan | 505/742 |
| 2-014801 | 1/1990 | Japan | 505/742 |

OTHER PUBLICATIONS

Bagley et al., "Plasma Oxidation of the High $T_c$ Superconducting Perovskites", Appl. Phys. Lett., vol. 51, No. 8, 24 Aug. 1987, pp. 622–624.
Journal of Superconductivity, vol. 1, No. 3, Sep. 1988, Plenum Publishing Corp. (Bristol, GB), R. B. Marcus et al.; pp. 295–302, see the abstract; figure 2.
Jpn. Journal of Applied Physics, vol. 27, No. 3, part 2; Letters, Mar. 1988 (Tokyo, Jp) S. Minomo Et al pp. L411–L413, see p. L411.
Applied Physics Letters, vol. 52, No. 25, 27 Jun. 1988, American Institute of Physics (New York, N.Y., US) W. Y. Lee et al.—pp. 2263–2265, see p. 2263.

Primary Examiner—Robert Kunemund
Attorney, Agent, or Firm—Cushman, Darby & Cushman

[57] ABSTRACT

A method for activating superconducting material comprises generating a species of oxygen ions, heating the material and introducing the oxygen ions to said material by the application of a low-gradient drift field between the source of oxygen ions and a substrate including the superconducting material.

6 Claims, 2 Drawing Sheets

METHOD OF ACTIVATION OF SUPERCONDUCTORS AND DEVICES PRODUCED THEREBY

This is a continuation of application Ser. No. 08/35,899, filed on Mar. 23, 1993, which was abandoned upon the filing hereof abandoned and which was a continuation of 07/634,861 filed Jan. 2, 1991 which was also abandoned.

BACKGROUND OF THE INVENTION

1. Field of the Invention

This invention relates to a method for the activation of superconductors and to devices incorporating superconductors. It finds particular application in the fabrication of semiconductor devices which have integral regions of superconductive material.

2. Description of the Related Art

At present, there exist superconductors which exhibit the properties of a superconductor at temperatures substantially greater than 77° K. (−196° C.), the boiling point of liquid nitrogen. Such superconductors commonly comprise copper oxide ceramics typically fabricated from a mixture of yttrium oxide, barium carbonate and copper oxide. These constituent materials may simply be provided in a mortar in the volume ratios 1:2:3 and ground into a powder mixture. The mixture is then heated for about nine hours at temperatures in the region of 900° C. to 1100° C. At this temperature, the chemical reactions that produce the ceramic superconductor take place. It is then necessary to cool the ceramic at an accurately controlled rate so as not to degrade the superconducting properties.

The powder produced at this stage comprises superconducting material, the superconducting properties of which may be enhanced if the material is subject to a further process. This further process is included so as to 'activate' the superconducting material by sintering or fusing the grains of the material and also, equilibrating the oxidation of the ceramic. Prior to this further process the ceramic powder is typically compressed so as to form a pellet of the material.

The further process typically includes heating the material for many hours at a temperature of up to 1000° C. in an oxygen-rich environment, provided by introducing a flow of oxygen in the region of the material as it is heated. It is again important to control the rate at which the material cools after this further process, i.e. annealing, is complete.

The above described method of activating the superconductor is disadvantageous since it is unable to generate a substantial amount of superconductivity even with materials having a highly perfect crystal structure which is devoid of pores. This disadvantage is partly associated with the rate at which the oxygen diffuses through the material and also with the reactivity of the material even at high temperatures.

European Patent Application No. EP0286106A (Hitachi) describes a process for controlling an oxygen content of a non-superconductive or superconductive oxide in which a beam of particles such as ions, electrons, or neutrons or electromagnetic radiation is applied to the non-superconductive or superconductive oxide of a perovskite type such as $YBa_2Cu_3)_{7-x}$, thereby increasing or reducing the oxygen content of the oxide at the sites of oxygen in the crystal lattice of the oxide. Heat treatment at temperatures in excess of 500° C. associated with the process convert the material into a high $T_C$ superconductor.

European Patent Application No. EP0288001A (Nissin Electric Company Ltd.) describes a process for producing a superconducting thin film in which a group IIa metal and/or an oxide thereof, a group IIIa metal and/or an oxide thereof, and copper and/or an oxide thereof are supplied on a substrate which is irradiated with a neutral oxygen beam and heat treated at a temperature of 700° C., thereby forming a superconductive thin film of IIa-IIIa-Cu oxide.

Conventional integrated circuits and other semiconductor devices have inherent disadvantages which result from the resistance of the metal tracks that are used as connections between the various devices. The availability of superconducting materials, and in particular those materials which remain superconducting at temperatures above 70° K., has provided an opportunity to reduce this connecting track resistance to zero.

However, due to the structure of the semiconductor of which the metal connecting tracks are commonly located, the formation of superconductor materials on such devices is not readily achieved.

It would therefore be advantageous if a semiconductor device could be provided having a structure which utilises a superconductor material.

European Patent Application No. EP0276746A (Hitachi Limited) describes a superconducting device which has a structure of semiconductor-superconductor or superconductor-normal conductor. The superconductors constituting the superconducting device are made of a superconducting oxide material of $K_2CuF_4$ type or perovskite type crystalline structure which contains at least one element selected from Ba, Sr, Ca, Mg and Ra; at least one element selected from La, Y, Ce, Sc, Sm, Eu, Er, Gd, Ho, Yb, Nd, Pt, Lu, and Tc; Cu; and O.

European Patent Application No. EP0295708A (Fujitsu Limited) describes an integrated circuit where the wiring layer is formed of superconductive materials, an electrode formed of normal metals i.e. non-superconductive metals, such as aluminium, connects a part of semiconductor region via a barrier metal such as tin, to the superconductive layer wiring at least at the superconductive layer wiring's side wall which is essentially orthogonal to the layer wiring.

SUMMARY OF THE INVENTION

We have found that, by use of a beam of oxygen ions and the application of a potential difference between the oxygen ion source and mounting means on which a substrate is placed it is possible to activate superconducting material at relatively low temperatures. This renders it feasible to form superconducting regions adjacent regions of semiconductor material, and thus, for example, interconnect patterns for semiconductor integrated circuits.

According to the present invention a method for activating superconducting material comprises generating a species of oxygen ions, heating the material and introducing said oxygen ions to said material by the application of a potential difference between a source of said oxygen ions and a substrate including said superconducting material.

Preferably, the oxygen ions comprise negative ions.

Preferably, the negative oxygen ions are generated in a gaseous plasma and extracted therefrom by the application thereto of a d.c. electric field.

The gaseous plasma is advantageously initiated in gas such as purified oxygen, a flow of which is preferably provided in the region of plasma generation. Also, the gaseous plasma is advantageously generated by the application of an a.c. electric field to the gas, which a.c. electric field preferably oscillates at RF or microwave frequencies.

Preferably, the heat is conducted onto the material, although it may alternatively be radiated towards the material.

According to another aspect of the prevent invention a method for producing a semiconductor device incorporating a superconductor material comprises forming a first material on a semiconductor material, forming a superconductor material on the first material and anodising the composite structure so as to activate the superconductor material and produce an insulating region in the first material.

Preferably, the first material is grown epitaxially on the semiconductor material and advantageously the superconductor material is grown epitaxially on the first material.

The anodisation of the composite structure advantageously causes substantially all of the first material to form a barrier layer.

Preferably, the first material comprises aluminium, such that the anodisation thereof forms an insulating region of amorphous alumina ($Al_2O_3$). As such the semiconductor material comprises gallium arsenide (GaAs) which is preferably separated from the aluminium by the provision of a region of aluminium gallium arsenide (AlGaAs). This is particularly advantageous since GaAs has a high quality interface to AlGaAs, and it is possible to grow aluminium epitaxially on AlGaAs.

According to a further aspect of the present invention a structure for forming a semiconductor device comprises a superconductor material disposed on aluminium, wherein the aluminum is disposed on a region comprising AlGaAs, which is disposed on a region comprising GaAs.

According to yet a further aspect of the present invention a semiconductor device comprises an activated superconductor material disposed on amorphous alumina, which alumina is disposed on a region comprising GaAlAs which is disposed on a region comprising GaAs.

BRIEF DESCRIPTION OF THE DRAWINGS

The invention is described further hereinafter, by way of example only, with reference to the accompanying drawings, in:

FIG. 3b shows the structure of the device of FIG. 2 after anodisation as shown in FIG. 3a.

DESCRIPTION OF THE PRESENTLY PREFERRED EMBODIMENT OF THE PRESENT INVENTION

Figure 1:
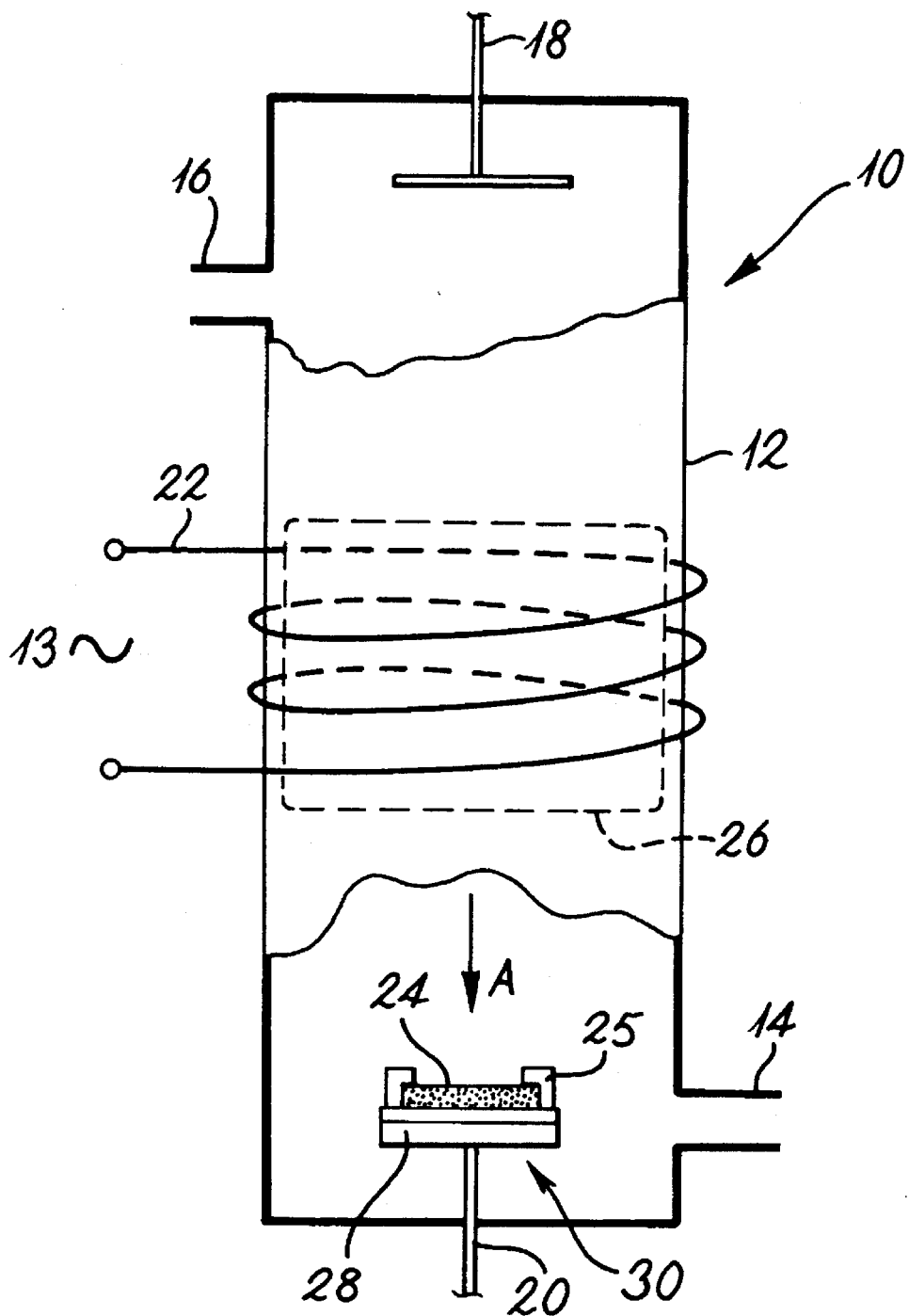
FIG. 1 is a diagrammatic representation of one embodiment of apparatus adapted for use in the method according to the present invention.

Referring now to FIG. 1, the apparatus features a plasma anodiser 10 comprising an elongate quartz or other tube 12 having an inlet connector 14 and an outlet connector 16 in the side wall at respective ends thereof. A cathode 18 and an anode 20 are also provided at respective ends of the quartz tube 12. The anode 20 is adapted to form a pedestal 30 on which a sample 24 of superconductive material is located during the superconductor activation process. The pedestal 30 further comprises a heating element 28 for heating the sample 24. A coil 22 is located around the circumference of the mid-region of the elongate quartz tube 12 and is connected to an a.c. power source B which operates at R.F. frequencies.

As an advantageous alternative, a thin oxide layer is grown on the pedestal 30 so as to produce an $O^-$ boundary layer within the superconducting material.

One particular method of activating superconductive material according to the present invention is now described hereinbelow with reference to the apparatus outlined hereinabove.

A sample 24 of the superconducting material, for example a pellet of ceramic made from the compounds yttrium oxide, barium carbonate and copper oxide is located on the pedestal 30. The pellet of ceramic 24 and the heating pedestal 30 are housed in a quartz or insulating shield 25 so that the current which flows as a result of the applied d.c. field passes through the exposed face of the ceramic pellet; and thence to the external circuit. Heat is applied to the sample 24 by way of the heating element 28. Purified oxygen is introduced to, and extracted from the quartz tube 12 via the inlet 14 and outlet 16 respectively. The a.c. supply B is switched on and connection made to the coil 22. An a.c. electric field oscillating at R.F. frequency is thus developed in the inner region of the quartz tube 12 surrounded by the coil 22. A gaseous plasma 26 is therefore induced in this inner region of the quartz tube 12.

A d.c. electric field is applied between the cathode 18 and anode 20, the electric field lines of which pass through the gaseous plasma 26 in a direction substantially perpendicular to the radial plane of the coil 22.

Negative oxygen ($O^-$) ions are separated from the gaseous plasma by means of the d.c. electric field and are directed (arrow A) towards the anode 20, and thus the sample 24, on which they impinge.

The $O^-$ ions penetrate a thickness of the material sample 24 in the order of mm, and thus, depending on the dimensions of the sample, may render the whole of the material suitably superconductive.

The activation of the superconductive material results from the action of the O– ions generated by the plasma anodisation process.

By positioning the sample outside the plasma region, problems due to sputtering and surface damage caused by energetic species in the plasma are avoided.

The plasma generates large numbers of $O^-$ ions which are then extracted by a low drift field of the order of volts. By allowing a current to flow into the substrate, problems caused by charging are also avoided.

Further, the sample 24 may comprise a composite semiconductor/superconductor structure, which after the anodisation process, comprises a semiconductor device.

Figure 2:
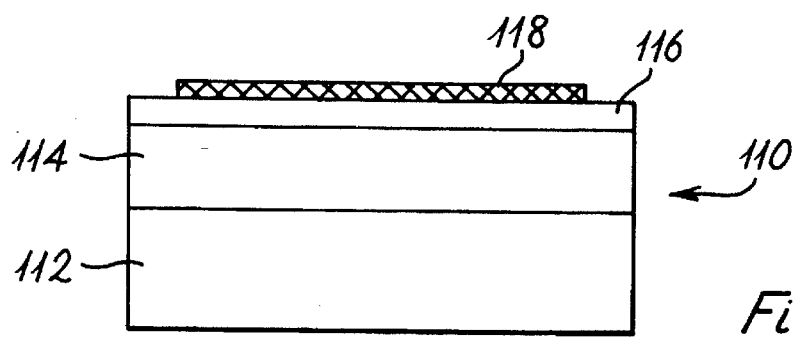
FIG. 2 is a section through one embodiment of a structure for forming a semiconductor device in accordance with the present invention.

FIG. 2 shows a layered structure 110 for forming a semiconductor device incorporating superconductive material. The structure 110 comprises a layer 112 of gallium arsenide (GaAs) on which a layer 114 of aluminium gallium arsenide (AlGaAs) is disposed. On the layer 114 of AlGaAs a layer 116 of aluminium (Al) is disposed and on the layer 116 of Al, there is located an inactivated layer 118 of superconductive material.

The layer 112 of GaAs has a good interface to the layer 114 of AlGaAs. The layer 116 of Al is grown epitaxially on the layer 114 of AlGaAs and the layer 118 of inactivated superconductive material is grown on the layer 116 of Al.

Figure 3A:
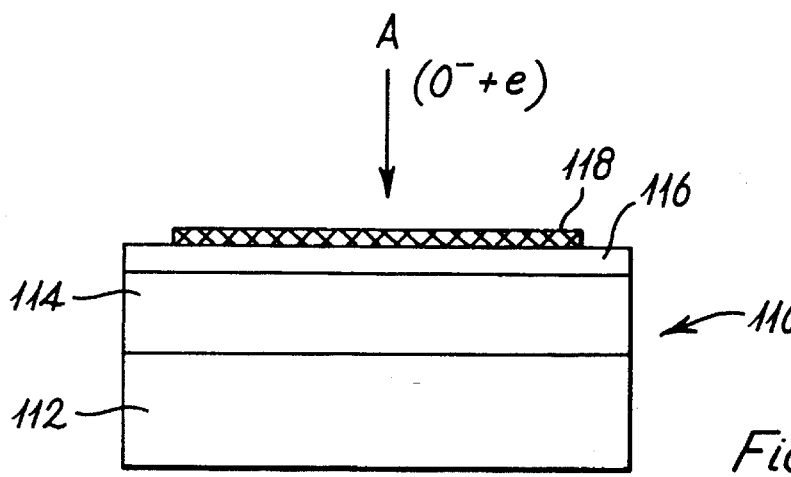
FIG. 3a shows the structure of FIG. 2 during anodisation.

As illustrated in FIG. 3a the structure 110 is exposed to a stream of negative oxygen ions ($O^-$) and electrons (e), arrow A, during anodisation of the structure in an oxygen plasma.

Figure 3B:
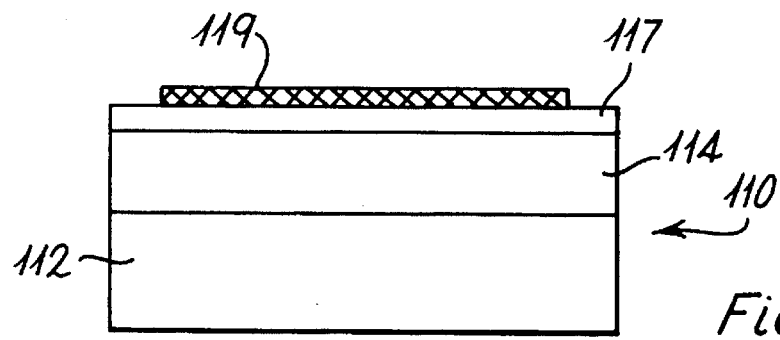

As illustrated in FIG. 3b, plasma anodisation of the structure 110 causes anodisation of the layer 116 (FIG. 2) of Al to produce a layer 117 of amorphous alumina ($Al_2O_3$) whilst simultaneously activating the superconductive layer 118 (FIG. 2), so as to produce a layer 119 of activated superconductor material.

An activated single crystal superconducting film 119 is thus produced on top of the amorphous alumina. A layer of superconducting material, with all its inherent advantages, and having a high performance with respect to current density and critical temperature, may therefore be provided as a connecting track on a semiconductor device. A device is therefore provided with connecting tracks which exhibit zero resistance, which is particularly advantageous with devices formed of materials of high electron mobility, such as gallium arsenide.

The invention is not restricted to the details of the foregoing embodiment. For example, the structure of the device is not limited to the layered structure illustrated, and in particular the superconductor material may be provided in any predetermined pattern or location on the device. Further, the superconductor material may advantageously be incorporated in very large-scale integration (VLSI) devices and therefore form part of a complex interconnected structure.

Further, the composite structure according to the present invention may be subjected to the anodisation process by way of a conventional plasma anodiser apparatus, and more particularly, by way of a plasma anodiser in which the cathode is disposed below the anode and the composite structure is located on a supporting/shielding platform.

Advantageously, small quantities of water vapour may be introduced in the anodisation process.

Other materials may be used in place of aluminium. Suitable materials include silicides, copper, silver, molybdenum, chromium and yttrium.

I claim:

1. A method for activating superconducting material comprising the steps of:

forming a first material on a substrate of semiconductor material, wherein said first material is epitaxially grown on said semiconductor material;

forming a superconductor material on said first material defining a layered structure;

generating a species of oxygen ions in a plasma;

heating said layered structure; and introducing said oxygen ions to said layered structure by the application of a drift field between a source of said oxygen ions and a substrate including said layered structure while maintaining said layered structure outside said plasma so as to actuate said superconductor material and produce an insulated region in said first material.

2. A method for activating superconducting material comprising the steps of:

forming a first material on a substrate of semiconductor material;

forming a superconductor material on said first material defining a layered structure, wherein said superconductor material is epitaxially grown on said first material;

generating a species of oxygen ions in a plasma;

heating said layered structure; and introducing said oxygen ions to said layered structure by the application of a drift field between a source of said oxygen ions and a substrate including said layered structure while maintaining said layered structure outside said plasma so as to actuate said superconductor material and produce an insulated region in said first material.

3. A method for activating superconducting material comprising the steps of:

forming a first material on a substrate of semiconductor material;

forming a superconductor material on said first material defining a layered structure;

generating a species of oxygen ions in a plasma;

heating said layered structure;

introducing said oxygen ions to said layered structure by the application of a drift field between a source of said oxygen ions and a substrate including said layered structure while maintaining said layered structure outside said plasma so as to actuate said superconductor material and produce an insulated region in said first material, wherein said first material comprises aluminum and said semiconductor material comprises gallium arsenide; and separating said gallium arsenide from said aluminum by a region of aluminum gallium arsenide.

4. A method for activating superconductor material comprising the steps of:

forming a first material on a substrate of semiconductor material, wherein said first material is grown epitaxially on said semiconductor material;

forming a superconductor material on said first material defining a layered structure;

generating a species of oxygen ions in a plasma;

heating said layered structure by radiating heat toward said layered structure; and introducing said oxygen ions to said layered structure by the application of a drift field between a source of said oxygen ions and a substrate including said layered structure while maintaining said layered structure outside said plasma so as to actuate said superconductor material and produce an insulated region in said first material.

5. A method for activating superconductor material comprising the steps of:

forming a first material on a substrate of semiconductor material;

forming a superconductor material on said first material defining a layered structure, wherein said superconductor material is grown epitaxially on said first material;

generating a species of oxygen ions in a plasma;

heating said layered structure by radiating heat toward said layered structure; and introducing said oxygen ions to said layered structure by the application of a drift field between a source of said oxygen ions and a substrate including said layered structure while maintaining said layered structure outside said plasma so as to actuate said superconductor material and produce an insulated region in said first material.

6. A method for activating superconductor material comprising the steps of:

forming a first material on a substrate of semiconductor material;

forming a superconductor material on said first material defining a layered structure;

generating a species of oxygen ions in a plasma;

heating said layered structure by radiating heat toward said layered structure;

introducing said oxygen ions to said layered structure by the application of a drift field between a source of said oxygen ions and a substrate including said layered structure while maintaining said layered structure outside said plasma so as to actuate said superconductor material and produce an insulated region in said first material, wherein said semiconductor material comprises gallium arsenide and said first material comprises aluminum; and separating said gallium arsenide from said aluminum by a region of aluminum gallium arsenide.

* * * * *

UNITED STATES PATENT AND TRADEMARK OFFICE
CERTIFICATE OF CORRECTION

PATENT NO. : 5,498,595
DATED : March 12, 1996
INVENTOR(S) : ECCLESTON

It is certified that error appears in the above-indentified patent and that said Letters Patent is hereby corrected as shown below:

On the title page, item [63] should —Continuation of Ser. No.35,899, Mar. 23, 1993, abandoned, which is a continuation of Ser. No. 634,861, Jan, 2, 1991, abandoned, which was the national stage of international application number PCT/GB89/00734, filed Jun. 30, 1989—.

Signed and Sealed this

Twenty-seventh Day of August, 1996

Attest:

BRUCE LEHMAN

*Attesting Officer*  *Commissioner of Patents and Trademarks*